United States Patent
Sakuma et al.

(10) Patent No.: US 8,026,176 B2
(45) Date of Patent: *Sep. 27, 2011

(54) FILM FORMING METHOD, PLASMA FILM FORMING APPARATUS AND STORAGE MEDIUM

(75) Inventors: Takashi Sakuma, Nirasaki (JP); Taro Ikeda, Nirasaki (JP); Osamu Yokoyama, Nirasaki (JP); Tsukasa Matsuda, Albany, NY (US); Tatsuo Hatano, Nirasaki (JP); Yasushi Mizusawa, Albany, NY (US)

(73) Assignee: Tokyo Electron Limited, Tokyo-To (JP)

( * ) Notice: Subject to any disclaimer, the term of this patent is extended or adjusted under 35 U.S.C. 154(b) by 398 days.

This patent is subject to a terminal disclaimer.

(21) Appl. No.: 12/223,781

(22) PCT Filed: Feb. 9, 2007

(86) PCT No.: PCT/JP2007/052385
§ 371 (c)(1),
(2), (4) Date: Aug. 8, 2008

(87) PCT Pub. No.: WO2007/091682
PCT Pub. Date: Aug. 16, 2007

(65) Prior Publication Data
US 2010/0167540 A1    Jul. 1, 2010

(30) Foreign Application Priority Data
Feb. 9, 2006   (JP) .................... 2006-033022

(51) Int. Cl.
*H01L 21/311* (2006.01)

(52) U.S. Cl. ........ 438/695; 438/629; 438/696; 438/761; 257/E21.332; 257/E21.588

(58) Field of Classification Search .................. 438/632, 438/698, 625, 629, 761, 763, FOR. 388; 257/E21.218, E21.332, E21.588
See application file for complete search history.

(56) References Cited

U.S. PATENT DOCUMENTS
5,275,330 A * 1/1994 Isaacs et al. ............. 228/180.21
5,716,869 A * 2/1998 Hibino et al. .............. 438/632
(Continued)

FOREIGN PATENT DOCUMENTS
JP         10-74760        3/1998
(Continued)

*Primary Examiner* — Matthew Smith
*Assistant Examiner* — Quovaunda Jefferson
(74) *Attorney, Agent, or Firm* — Smith, Gambrell & Russell, LLP

(57) ABSTRACT

A technique for embedding metal in a microscopic recess provided in the surface of a process object, such as a semiconductor wafer, by plasma sputtering. A film forming step and a diffusion step are alternately performed a plurality of times. The film forming step deposits a small amount of metal film in the recess. The diffusion step moves the deposited metal film towards the bottom portion of the recess. In the film forming step, bias power to be applied to a stage for supporting the wafer is set to a value ensuring that, on the surface of the wafer, the rate of metal deposition due to the drawing-in of metal particles is substantially equal to the rate of the sputter etching by plasma. In the diffusion step, the wafer is maintained at a temperature which permits occurrence of surface diffusion of the metal film deposited in the recess.

12 Claims, 8 Drawing Sheets

U.S. PATENT DOCUMENTS

| | | | |
|---|---|---|---|
| 5,936,829 A * | 8/1999 | Moslehi | 361/234 |
| 5,976,327 A * | 11/1999 | Tanaka | 204/192.15 |
| 6,184,137 B1 | 2/2001 | Ding et al. | |
| 6,259,592 B1 * | 7/2001 | Ono | 361/234 |
| 6,299,739 B1 | 10/2001 | Fujikawa et al. | |
| 6,762,500 B2 * | 7/2004 | Ahn et al. | 257/760 |
| 7,790,626 B2 * | 9/2010 | Ikeda et al. | 438/758 |
| 2003/0061989 A1 * | 4/2003 | Kamimura et al. | 118/712 |
| 2005/0151263 A1 | 7/2005 | Sakai et al. | |
| 2008/0200002 A1 * | 8/2008 | Suzuki et al. | 438/381 |

FOREIGN PATENT DOCUMENTS

| | | |
|---|---|---|
| JP | 10-214836 | 8/1998 |
| JP | 11-54612 | 2/1999 |
| JP | 11-307477 | 11/1999 |
| JP | 2000-77365 | 3/2000 |
| JP | 2000-174026 | 6/2000 |
| WO | 2005/067025 | 7/2005 |

* cited by examiner

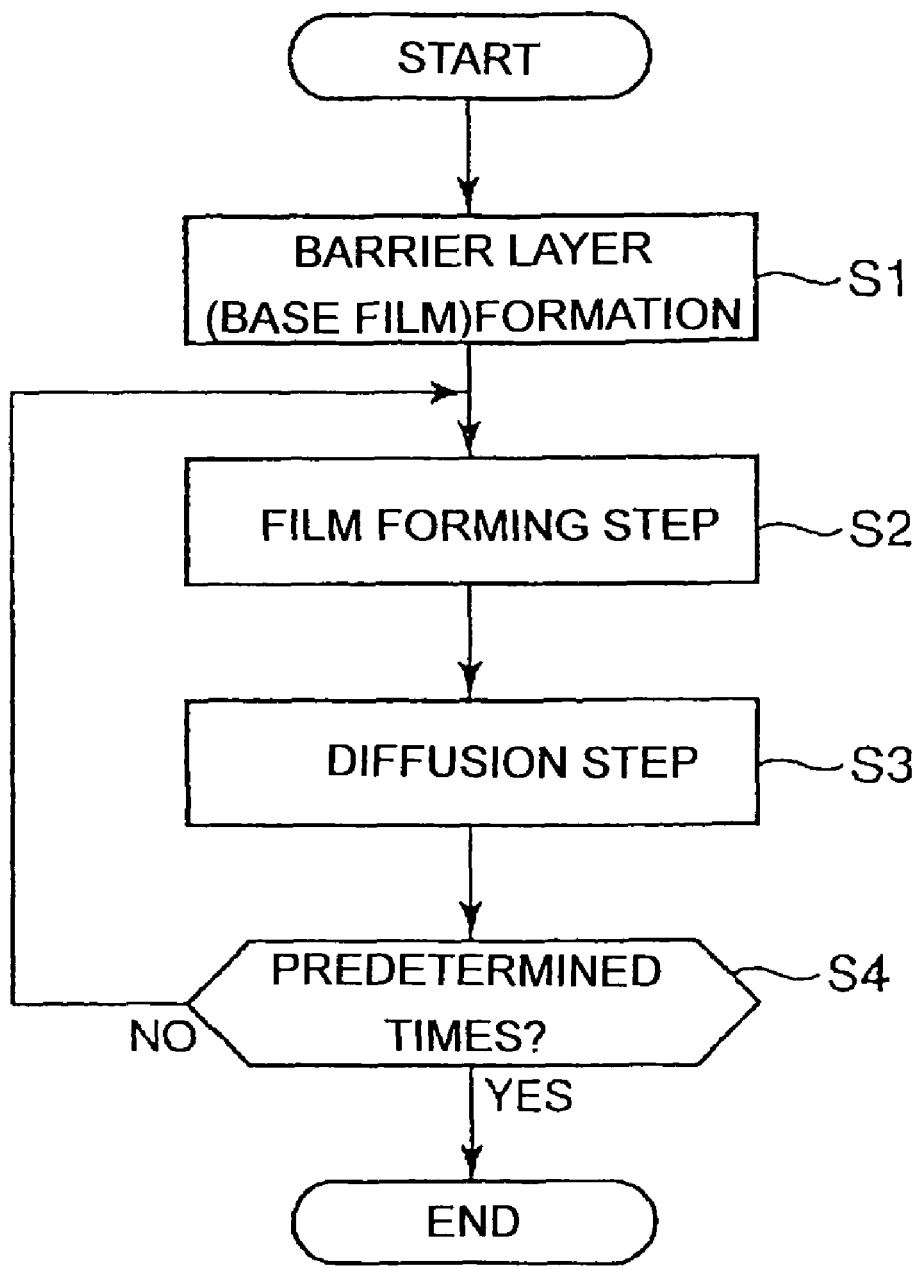
F I G . 4

CONVENTIONAL METHOD

⇩

(A)

PRESENT INVENTION METHOD

⇩

(B)

FILM FORMING METHOD, PLASMA FILM FORMING APPARATUS AND STORAGE MEDIUM

TECHNICAL FIELD

The present invention relates to a technique for embedding, by plasma sputtering, a metal film in a microscopic recess formed in a surface of a process object such as a semiconductor wafer.

BACKGROUND ART

In order to manufacture a semiconductor device, in general, various processes such as film formation and pattern etching are repeatedly performed to a semiconductor wafer. In response to the demand for higher integration and miniaturization of a semiconductor device, the line width and the hole diameter have been reduced more and more. As a result, it is necessary to reduce electrical resistance of a wiring material and an embedding material. Therefore, there is the tendency that copper, which has small electrical resistance and is inexpensive, is used as the wiring material and the embedding material. When copper is used as the wiring material and the embedding material, tantalum (Ta) metal and/or a tantalum nitride (TaN) film are/is used as a barrier layer.

In order to embed copper in recesses formed in the surface of a wafer, in general, a thin seed film made of a copper film is formed on the entire surface of the wafer including inner surfaces of the recesses by using a plasma sputtering apparatus. Next, a copper plating process is performed to the entire surface of the wafer including the inner surfaces of the recesses to completely embed the film in the recesses. After that, an unnecessary portion of the thin copper film present on the surface of the wafer is removed by a chemical mechanical polishing (CMP) process.

This method will be described with reference to FIGS. 9 and 10(A) to 10(C). As shown in FIG. 9, a recess 2 in a form of an elongated groove having a rectangular cross section and a recess 4 in a form of a via hole or a through hole formed in a bottom of the recess 2 are formed in an insulating layer 3 formed on a semiconductor wafer W. The lower end of the recess 4 is connected with a wiring layer 6. When a conductive material is embedded in the recess 4, the wiring layer 6 and a wiring material embedded in the recess 2 are electrically connected with each other. Such a structure is called a dual-damascene structure. Only a trench (recess 2) or a hole (recess 4) may be provided independently. In recent years, the widths the recess 2 and the diameter of the recess 4 have been significantly reduced due to refinement of a design rule, and as a result, the vertical/transverse size ratio (aspect ratio) of the recesses has been increased, and is approximately 3 to 4, for example.

A method for embedding copper in the recess 4 in the form of a hole will be described with reference to FIG. 10. As shown in FIG. 10(A), a barrier layer 8 having a laminated structure composed of a TaN film and a Ta film is already formed on the surface of a semiconductor wafer W including inner surfaces of the recess 4 by a plasma sputtering apparatus. A seed film 10 made of a thin copper film is formed on the entire surface of the wafer including the inner surfaces of the recess 4. During the formation of the seed film 10, high frequency bias power is applied to the semiconductor wafer to draw metal ions of copper with high efficiency. Next, a metal film 12 made of, for example, a copper film is embedded in the recess 4 by performing a ternary copper alloy plating process to the surface of the wafer as shown in FIG. 10(C). In this case, the recess 2 which is in the form of a groove and is not shown in FIGS. 10(A) to 10(C) is embedded with the copper plating. After that, unnecessary portions of the metal film 12, unnecessary portions of the seed film 10 and unnecessary portions of the barrier layer 8, which are present on the surface of the wafer W, are removed by a CMP process.

In general, in a case where a film is formed by a plasma sputtering apparatus, the film formation rate is increased by applying bias power to the semiconductor wafer to promote drawing of metal ions. If the bias voltage is excessively large in this case, the surface of the wafer is sputtered by ions derived from an inert gas such as argon gas introduced in the processing space to generate plasma, and as a result, the metal film once deposited is removed. To avoid this, the bias power is not set to a high level.

When the seed film 10 made of a copper film is formed in the aforementioned way, an overhang 14 is formed in the seed film 10 in the vicinity of the upper open end of the recess 4 to narrow the opening of the recess 4 as shown in FIG. 10(B). A plating solution does not sufficiently penetrate into the recess 4 due to the presence of the overhang 14 during the plating process. Due to the insufficient penetration of the plating solution, a void 16 may be developed in the metal film 12.

To prevent the void 16, various additive agents are added to the plating solution in the copper plating process in order to promote deposition of the copper film onto the bottom surface of the recess 4 to embed the recess 4 in a bottom-up manner. Although a small amount of the additive agents remain in the copper plating film immediately after the copper plating process, the remaining additive agents can be removed by a high-temperature annealing process which is generally performed after the plating process.

If the line width and the hole diameter are not larger than 100 nm, however, the remaining additive agents, which could have been easily removed by the high-temperature annealing, cannot be sufficiently removed. If the additive agents remain in the copper film, electrical resistance of a wiring becomes larger, and as a result, designed electrical characteristics cannot be obtained. In addition, the remaining additive agents suppress the growth of copper grains during the annealing and reduce reliability of the copper film.

To avoid the problem with the additive agents, it has been considered to embed the entire recess 4 with the copper film only by the plasma sputtering process without performing the plating process. In this case, however, the overhang 14 is formed in the vicinity of the upper open end of the recess 4 as described above. It is, therefore, difficult for metal particles to reach the inside of the recess 4, and the void 16 will be unavoidably developed. In order to avoid this problem, it may be considered that the deposited metal film is melted at a high temperature and reflows to embed the recess, as taught by JP10-74760A and JP10-214836A. If the embedding material is aluminum having a low melting point, the reflow process can be performed. If the embedding material is copper having a high melting point, the reflowing is hardly occur. Therefore, the aforementioned reflow process is not a practical solution in the case of copper.

DISCLOSURE OF THE INVENTION

The present invention focuses on the aforementioned problems and is devised to effectively solve the problems. An object of the present invention is to provide a technique capable of effectively and appropriately embedding a microscopic recess only by means of a plasma sputtering technique without developing a void.

In order to attain the objective, according to a first aspect of the present invention, there is provided a film forming method, which includes: a step of placing a process object on a stage disposed in a process vessel, the substrate having a surface and a recess opening into the surface; a film forming step including a step of generating metal particles in the process vessel by generating plasma in the process vessel, by sputtering a metal target disposed in the process vessel by the plasma, and by applying bias power to the stage to draw the metal particles into the recess and deposit the metal particles in the recess, thereby embedding the recess with a metal, wherein the film forming step is performed under conditions that the bias power is set such that, on the surface of the process object, a deposition rate which is a rate of metal deposition caused by drawing-in of the metal particles is substantially equal to an etch rate which is a rate of sputter etching caused by the plasma; a diffusion step that maintains the process object at a predetermined temperature ensuring that surface diffusion occurs in a metal film deposited in the recess under conditions that no metal particles generated from the metal target, thereby to move metal atoms constituting the metal film toward a bottom portion of the recess; and a step of alternately and repeatedly performing the film forming step and the diffusion step a plurality of times.

Preferably, the bias power is of a level ensuring that a base layer, which has been formed on surfaces of the recess before said film forming method is performed, is not etched. Preferably, the predetermined temperature is lower than any temperatures at which volume diffusion of the metal atoms constituting the metal film occurs. Preferably, in the diffusion step, the process object is heated by collision energy generated by collision of plasma with the process object. Preferably, the diffusion step is performed in the process vessel in which the film forming step is performed.

Preferably, the recess comprises a groove having a width of 100 nm or less, or a hole having a diameter of 100 nm or less. Preferably, thickness of the metal film formed in each of the film forming steps is 5 nm or less. Preferably, the recess comprises a groove for wiring or a hole for wiring.

Preferably, the metal film is made of copper or a copper alloy. Preferably, the predetermined temperature in the diffusion step is in a range of 200° C. to 400° C.

In one embodiment, the recess has a relatively small lower space and a relatively large upper space, and there is performed a plating step that embeds the upper space with a plating after the lower space is embedded with the metal film by repeatedly performing the film forming step and the diffusion step. In another embodiment, the recess has a relatively small lower space and a relatively large upper space, and both the lower space and the upper space are embedded with the metal film by repeatedly performing the film forming step and the diffusion step.

According to a second aspect of the present invention, there is provided a film forming apparatus including: a process vessel adapted to be evacuated; a stage for placing a process object thereon; gas introducing means for introducing a process gas into the process vessel; a plasma source for generating plasma in the process vessel; a metal target disposed in the process vessel; a direct current power supply for supplying power for discharge to the metal target; a bias power supply for supplying bias power to the stage; and an apparatus controller for controlling whole operations of said film forming apparatus, wherein the apparatus controller is configured to control said film forming apparatus to cause said film forming apparatus to perform: a film forming step including a step of generating metal particles in the process vessel by generating plasma in the process vessel, by sputtering a metal target disposed in the process vessel by the plasma, and by applying bias power to the stage to draw the metal particles into a recess formed in a surface of the process object and deposit the metal particle in the recess, thereby embedding the recess with a metal, wherein the film forming step is performed under conditions that the bias power is set such that, on the surface of the process object, a deposition rate which is a rate of metal deposition caused by drawing-in of the metal particles is substantially equal to an etch rate which is a rate of sputter etching caused by the plasma; a diffusion step that maintains the process object at a predetermined temperature ensuring that surface diffusion occurs in a metal film deposited in the recess under conditions that no metal particles generated from the metal target, thereby to move metal atoms constituting the metal film toward a bottom portion of the recess; and a step of alternately and repeatedly performing the film forming step and the diffusion step a plurality of times.

In one embodiment, the stage has means for cooling the process object. Additionally or alternatively, the stage has means for heating the process object. Additionally or alternatively, a gas groove, through which a thermally conductive gas flows, is provided in the surface of the stage.

According to a third object of the present invention, there is provided a storage medium storing a program for controlling a film forming apparatus, the film forming apparatus including: a process vessel adapted to be evacuated; a stage for placing a process object thereon; gas introducing means for introducing a process gas into the process vessel; a plasma source for generating plasma in the process vessel; a metal target disposed in the process vessel; a direct current power supply for supplying power for discharge to the metal target; a bias power supply for supplying bias power to the stage; and an apparatus controller in a form of a computer for controlling whole operations of said film forming apparatus, wherein the apparatus controller, upon execution of the program, controls the film forming apparatus to perform a film forming method, the film forming method including: a film forming step including a step of generating metal particles in the process vessel by generating plasma in the process vessel, by sputtering a metal target disposed in the process vessel by the plasma, and by applying bias power to the stage to draw the metal particles into a recess formed in a surface of the process object and deposit the metal particle in the recess, thereby embedding the recess with a metal, wherein the film forming step is performed under conditions that the bias power is set such that, on the surface of the process object, a deposition rate which is a rate of metal deposition caused by drawing-in of the metal particles is substantially equal to an etch rate which is a rate of sputter etching caused by the plasma; a diffusion step that maintains the process object at a predetermined temperature ensuring that surface diffusion occurs in a metal film deposited in the recess under conditions that no metal particles generated from the metal target, thereby to move metal atoms constituting the metal film toward a bottom portion of the recess; and a step of alternately and repeatedly performing the film forming step and the diffusion step a plurality of times.

BRIEF DESCRIPTION OF THE DRAWINGS

FIG. 4 is a flowchart showing an example of a film forming method according to the present invention.

BEST MODE FOR CARRYING OUT THE INVENTION

Figure 1:
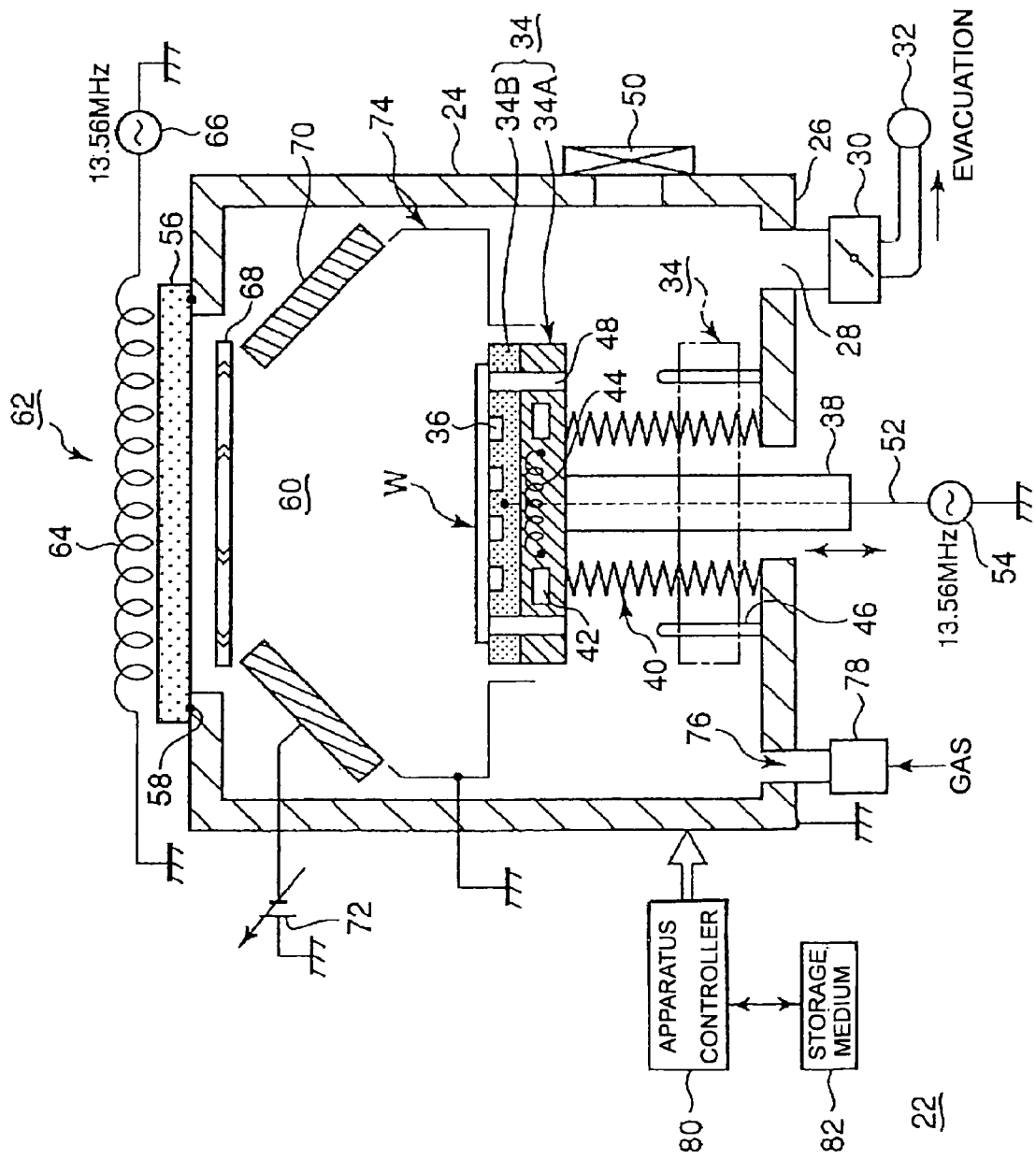
FIG. 1 is a schematic cross sectional view of a plasma film forming apparatus in one embodiment of the present invention.

An embodiment of the present invention will be described below with reference to the accompanying drawings. FIG. 1 is a schematic cross sectional view of a plasma film forming apparatus in one embodiment of the present invention, and the plasma film forming apparatus shown here is an ICP (inductively-coupled plasma) sputtering apparatus. In FIG. 1, the plasma film forming apparatus 22 has a cylindrical process vessel 24 which is made of aluminum or the like, for example. The process vessel 24 is electrically grounded. A discharge port 28 is provided in a bottom wall 26 of the process vessel 24. The discharge port 28 is connected to a vacuum pump 32 through a throttle valve 30 for adjusting pressure, whereby the interior of the process vessel 24 can be evacuated to a desired vacuum level.

A disk-shaped stage 34, which is made of aluminum for example, is disposed in the process vessel 24. The stage 34 has a stage body 34A and an electrostatic chuck 34B provided on the upper surface of the stage body 34A, and is configured to attract and hold a semiconductor wafer W, which is a process object, on the electrostatic chuck 34B. A gas groove 36, through which a thermally conductive gas flows, is formed in the upper surface of the electrostatic chuck 34B. Thermal conduction between the wafer W and the stage 34 can be improved by supplying the thermally conductive gas such as Ar gas to the gas groove 36 on demand. A direct voltage is applied to the electrostatic chuck 34B for attraction of the wafer W on demand. The stage 34 is supported by a support column 38 downwardly extending from a central portion of the bottom surface of the stage 34. A lower portion of the support column 38 extends through the bottom wall 26 of the process vessel 24. The support column 38 and thus the stage 34 connected thereto can move vertically by means of a elevating mechanism which is not shown in FIG. 1.

An extensible metal bellows 40 surrounds the support column 38. The upper end of the metal bellows 40 is joined to the lower surface of the stage 34 in an airtight manner, while the lower end of the metal bellows 40 is joined to the upper surface of the bottom wall 26 in an airtight manner. Accordingly, the metal bellows 40 allows the stage 34 to move vertically while maintaining airtightness of the interior of the process vessel 24. A cooling medium circulation path 42, as means for cooling the wafer W, is formed in the stage body 34A of the stage 34. A cooling medium is supplied to the cooling medium circulation path 42 through a path (not shown) provided in the support column 38 and then is discharged from the cooling medium circulation path 42. Means for heating the wafer W, e.g., a resistance heater 44 is provided in the stage body 36A, whereby the wafer W can be heated on demand.

The cooling means 42 and the heating means 44 are provided if needed, and may be omitted depending on process conditions of a process to be performed. A plurality of, for example, three support pins 46 (only two support pins are shown in FIG. 1) upwardly extend from the bottom wall 26 of the process vessel 24. Pin insertion holes 48 are formed in the stage 34 for the respective support pins 46. When the stage 34 descends, the support pins 46 penetrates through the respective pin insertion holes 48 and the wafer W is supported by the upper ends of the support pins 46. Under this state, the wafer W can be transferred between the support pins 46 and a carrying arm (not shown) which moves from the outside of the process vessel 24 into the process vessel 24. A gate valve 50, which opens when the carrying arm enters the process vessel 24, is provided at a lower portion of a side wall of the process vessel 24.

The electrostatic chuck 34B is connected with a bias power supply 54 through a wire line 52. The bias power supply 54 is capable of applying high frequency bias power having a predetermined frequency, e.g., 13.56 MHz, to the stage 34. The power output from the bias power supply 54 can be controlled on demand.

A transmission plate 56 is attached to the ceiling portion of the process vessel 24 via a sealing member 58 such as an O ring in an airtight manner. The transmission plate 56 is formed of a dielectric material such as aluminum oxide and has high-frequency wave permeability. A plasma source 62 is provided to supply excitation energy, which is necessary to convert a gas such as Ar gas for generation of plasma (hereinafter referred to as "plasma gas") into plasma, into a process space 60 in the process vessel 24. In place of the Ar gas, another inert gas such as He gas or Ne gas may be used as the plasma gas. Specifically, the plasma source 62 has an induction coil 64 provided above the transmission plate 56, and the induction coil 64 is connected with a high frequency power supply 66 for supplying power for plasma generation having a predetermined frequency, e.g., 13.56 MHz. A high frequency electromagnetic field can be introduced into the process space 60 through the transmission plate 56 by applying high frequency power (power for plasma generation) from the high frequency power supply 66 to the induction coil 64. The power for plasma generation, which is to be output from the high frequency power supply 66, can also be controlled on demand.

A baffle plate 68 is provided immediately below the transmission plate 56 and made of, for example, aluminum to diffuse the introduced high frequency waves. Provided below the baffle plate 68A is a metal target 70, which has an annular shape whose diameter decreases as approaching to metal target 70 is approached to the baffle plate 68, or a shape of the conical surface of a truncated conical shape, and which surrounds an upper area of the process space 60. The metal target 70 is connected to a variable direct current power supply 72 for supplying power for discharge. The direct current power output from the variable direct current power supply 72 can also be controlled on demand. A metal such as tantalum or copper may be used as the metal target 70. The metal target 70 is sputtered by argon ions contained in the plasma, whereby metal atoms or metal atom groups are released from the metal target 70, and most of them are ionized to become metal ions during the passage through the plasma.

A cylindrical protective cover 74 is provided below the metal target 70 to surround the process space 60. The protective cover 74 is made of, for example, aluminum. The protective cover 74 is electrically grounded. A lower portion of the protective cover 74 is bent inwardly and extends to the vicinity of the lateral side of the stage 34. A gas inlet port 76 is provided in the bottom wall of the process vessel 24 and serves as gas introducing means for introducing a required gas into the process vessel 24. A plasma gas, e.g., Ar gas and another required gas, e.g., $N_2$ gas are supplied from a process gas source (not shown), through a gas control unit 78 including a gas flow rate controller, a valve and the like, into the gas inlet port 76.

Various functional elements (devices, units) included in the film forming apparatus 22 are connected to an apparatus controller 80, which comprises, for example, a computer, and which controls the operation of each functional element. Specifically, the apparatus controller 80 controls the operations of the functional elements such as the bias power supply 54, the high frequency power supply 66 for plasma generation, the variable direct current power supply 72, the gas control unit 78, the throttle valve 30, the vacuum pump 32, and the like to cause the film forming apparatus 22 to perform a metal film forming process according to the present invention, mentioned later.

First, under the control of the apparatus controller 80, the vacuum pump 32 operates to form a vacuum in the process vessel 24, into which Ar gas is supplied with the gas control unit 78 being operated, and the throttle valve 30 is controlled to maintain the interior of the process vessel 24 at a predetermined degree of vacuum. After that, the variable direct current power supply 72 applies direct current power to the metal target 70. The high frequency power supply 66 applies high frequency power (for plasma generation) to the induction coil 64. In addition, the apparatus controller 80 transmits a command to the bias power supply 54 to apply predetermined bias power to the stage 34.

In the process vessel 24 under the foregoing conditions, the Ar gas is converted into plasma by the plasma power applied to the metal target 70 and the induction coil 64. Argon ions present in the plasma collides with the metal target 70, whereby the metal target 70 is sputtered. Metal particles, specifically metal atoms and metal atom groups, are released from the metal target 70, and most of them are ionized to become metal ions during the passage through the plasma. That is, metal particles containing metal ions and electrically-neutral metal atoms spatter downwardly. The metal ions are attracted by the bias power applied to the stage 34, fall on the wafer W with high directivity, and are deposited on the wafer W.

As described later, if the apparatus controller 80 provides the bias power supply 54 with a command instructing the bias power supply 54 to output a high power, Ar ions present in the plasma can also be attracted to the stage 34, whereby it is possible that both the film formation (deposition) and the sputter etching simultaneously occur on the wafer W. The control of various functional elements in the film forming apparatus 22 by the apparatus controller 80 is achieved by means of control signals or command signals generated upon execution of a control program stored in a storage medium 82 by the apparatus controller 80. The control program is configured to ensure that the various functional elements in the film forming apparatus 22 can achieve process conditions defined in a process recipe for forming a metal film. Any storage medium known in the computer technology may be used for storing the control program. For example, a floppy disk (FD) (registered trademark), a compact disc (CD) (registered trademark), a flash memory, a hard disk drive, or the like may be used as the storage medium.

Next, a film forming method according to the present invention performed by using the plasma film forming apparatus 22 will be described.

The feature of the below-described film-forming method is that a film forming step that deposits a metal film in the recess 4 provided in the surface of the wafer W by plasma sputtering and a diffusion step that diffuses metal atoms constituting the metal film deposited in the film forming step to move the metal atoms toward the bottom portion of the recess 4 (refer to FIG. 10) are alternately and repeatedly performed a plurality of times. The film forming step generates plasma (ions of the plasma gas, for example, Ar ions), sputters the metal target 70 by the generated plasma to generate metal particles (metal ions, a neutral metal atoms, and neutral metal atom groups), and draws the metal particle, especially the metal ions into the recess 4 by the bias power, wherein the bias power is set such that, on the surface of the wafer W, the deposition rate which is the rate of the metal deposition due to the drawing-in of the metal particles is substantially equal to the etch rate which is the rate of the sputter etching by the plasma. The diffusion step is performed by maintaining the wafer W at a predetermined temperature ensuring that surface diffusion occurs in the metal film deposited in the recess 4, under the conditions that metal particles are not generated from the metal target.

In this specification, in a case where additional layer(s) (the insulating layer 3 and the barrier layer 8 in FIG. 5) are already formed on the wafer W, the term "the surface (upper surface) of the wafer W", which is often used to explain the film forming step, generally means "the surface (upper surface) of the uppermost layer (the barrier layer 8 in FIG. 5) excluding the surfaces of the recess", in other words "the surface (upper surface) of a process object (including the wafer W and additional layer(s) thereon) outside the recess". It should be noted that the term "the surface (upper surface) of the wafer W" is used to avoid such a complicated expression.

In the film forming step, electric power parameters including the bias power, the direct current power, and the plasma power are controlled to appropriate values (the details are described later) to ensure that (i) the deposition of metal particles and the sputtering with the plasma simultaneously occur, and that (ii) the metal film is deposited in the recess 4, especially on the bottom portion of the recess 4, while the metal film is mostly not deposited on the surface (upper surface) of the wafer W, i.e., on portions of the wafer W outside the recess 4, or a very small amount of the metal film is deposited. Specifically, the bias power is set to a value ensuring that, on the surface of the wafer W, the rate of the metal particle deposition is substantially equal to the rate of the sputter etching by the plasma ($Ar^+$ ion), in other words, the film-growth rate is zero or very small).

In the following description, the term "deposition rate" means a deposition rate which is to be achieved assuming that the sputter etching does not occur; and the term "sputter etch rate" means an etch rate to be achieved assuming that metal particles are not deposited. In addition, the term "film growth rate" means a value obtained by subtracting the sputter etch rate from the deposition rate, in other words, an apparent deposition rate.

Figure 2:
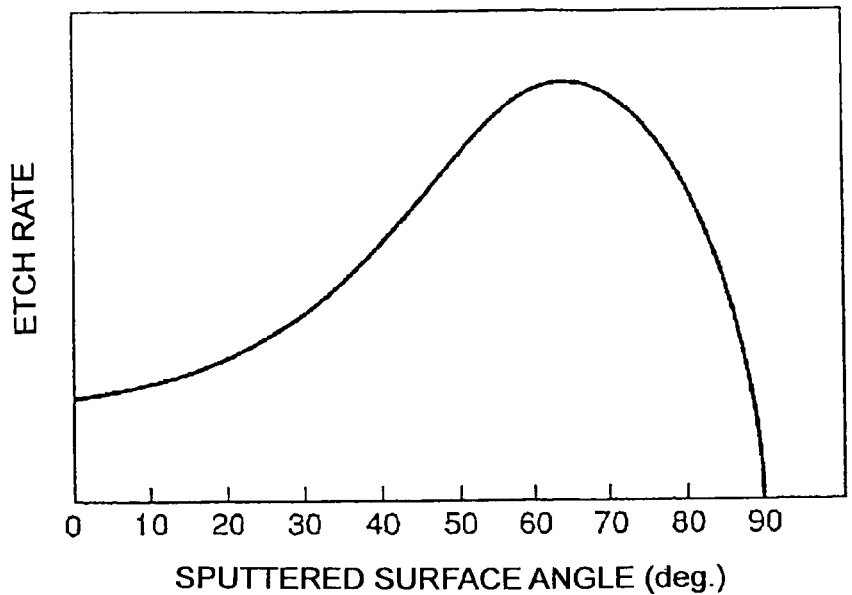
FIG. 2 is a graph showing the angle dependency of sputter etching.

The above will be described in detail. First, the characteristics of the plasma sputter etching will be described without consideration of the deposition of the metal particles. FIG. 2 is a graph showing the relationship between sputtered surface angle and etch rate. The term "sputtered surface" means a surface to be sputtered. The term "sputtered surface angle" means an angle formed between the normal line to the sputtered surface and the direction (vertical direction in the example of FIG. 1) in which the plasma (Ar ions) falls on the sputtered surface. The sputtered surface angle of the surface of the wafer W (upper surface of the wafer W, i.e., the portions outside the recess) and the sputtered surface angle of the bottom surface of the recess 4 are 0 degrees, while the sputtered surface angle of side surfaces of the recess 4 is 90 degrees.

As apparent from the graph shown in FIG. 2, the sputter etching occurs to some extent on the surface of the wafer W (sputtered surface angle=0 degrees), while the sputter etching mostly does not occur on the side surfaces of the recess (sputtered surface angle=90 degrees). It is also apparent from the graph shown in FIG. 2 that the sputter etching strongly occurs on a corner of the entrance of the recess, i.e., the vicinity of the open end of the recess (sputtered surface angle=40 to 80 degrees).

Figure 3:
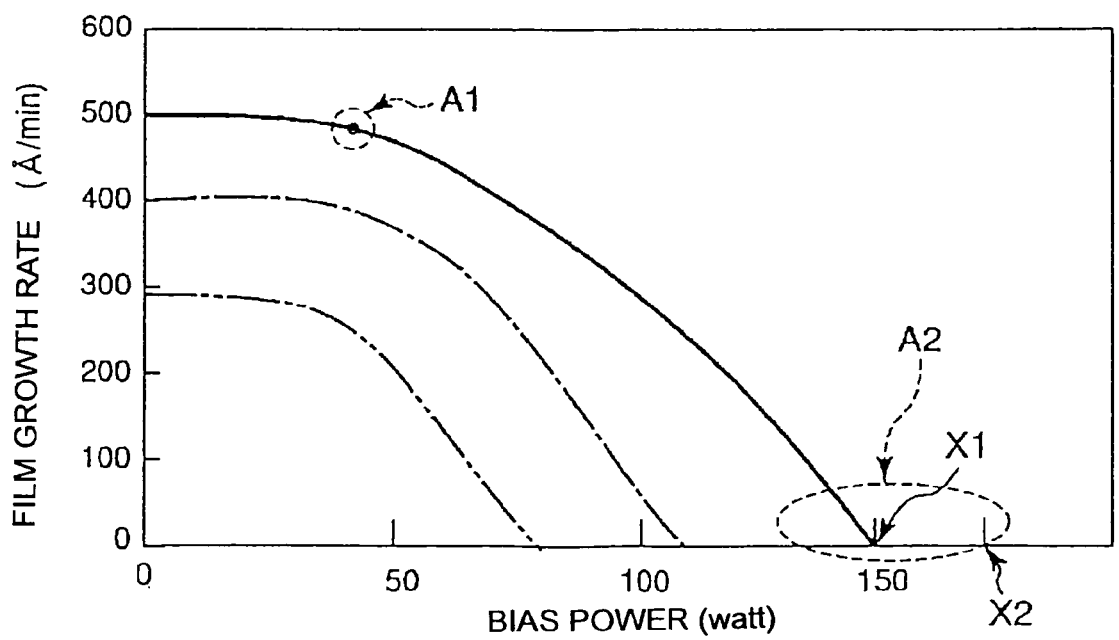
FIG. 3 is a graph showing the relationship between bias power and the film forming rate on the upper surface of a wafer.

FIG. 3 is a graph showing the relationship between the bias power applied to the wafer W (the stage) and the film growth rate (the deposition rate minus the sputter etch rate) on the surface of the wafer W, when the plasma power and the direct current power applied to the metal target 70 are constant in the ICP sputtering apparatus (film forming apparatus) as shown in FIG. 1. The graph shown in FIG. 3 indicates the relationship established when the target is copper and the size of the wafer is 200 mm. Although values on ordinate and abscissa axes may be varied when a material of the target or the size of the wafer is changed, the tendency of the curve shown in the graph remains substantially the same. As apparent from the graph shown in FIG. 3, when the bias power is not so large, the deposition rate of the metal particles (metal ions and neutral metal atoms) is higher than the etch rate, resulting in a high film growth rate. However, as the bias power is increased, increase of the etch rate of the sputter etching by ions derived from the plasma gas (Ar ions) accelerated by the bias power becomes larger than the increase of the deposition rate of the metal particles, resulting in reduction of the film growth rate.

When the deposition rate of the metal particles becomes the same as the sputter etch rate, the deposition and the etching are balanced out so that the apparent deposition rate on the surface (upper surface) of the wafer, i.e., the film growth rate becomes zero. Refer to a point X1 (the bias power=150 W) shown in FIG. 3. The relationship indicated by the solid line of the graph shown in FIG. 3 is changed to the relationship indicated by the alternate long and short dash line or the relationship indicated by an alternate long and two short dashes line, for example, when the plasma power and the direct current power are changed.

When a film is formed by using this type of the sputtering apparatus, it is general to use film forming conditions corresponding to region A1 shown in FIG. 3, i.e., film formation conditions under which the bias power is not so high such that a high film growth rate is achieved. Specifically, the film is formed under the conditions that the sputter etch rate is negligible small and the amount of drawn metal ions is the maximum. In this case, a considerably high film growth rate can be achieved at the bottom portion of the recess. On the contrary, the film forming step in the present embodiment is performed under the conditions that: the deposition of the drawn metal ions and the drawn neutral metal atoms, and the plasma sputter etching occur simultaneously; and that the film is mostly not formed on the surface (upper surface) of the wafer W, while the film is formed in the recess 4 although the film forming amount is small.

In more detail, in the film forming step, the film formation is performed under film forming conditions corresponding to region A2 of the graph shown in FIG. 3 ensuring that, on the surface (upper surface) of the wafer, the deposition rate of the metal particles is substantially equal to the etch rate of the plasma sputter etching, as described above. In the present specification, the term "substantially equal" includes not only the case where the film growth rate on the surface of the wafer is zero but also the case where the film is formed on the surface of the wafer at about up to three tenth (3/10) of the film growth rate at which the film is formed under film formation conditions corresponding to region A1 of the graph shown in FIG. 3. In this case, a certain amount of the film is formed in the recess 4, especially on the bottom portion of the recess 4.

Explanation will be made on the reason that the metal film is deposited in the recess 4 formed in the surface of the wafer W although the metal film is mostly not grown on the surface of the wafer W under the film forming conditions. When the metal film once deposited on the surface (upper surface) of the wafer is sputtered by the plasma, metal particles spatter to reach the inner wall surface of the process vessel 24 and the inner wall surface of the protective cover 74. On the other hand, when the metal film once deposited on the microscopic recess 4 (having a width or diameter of, for example, 100 nm or less (refer to FIG. 10)) is sputtered by the plasma, metal particles cannot get out of the recess 4 and are again attached to the inner wall surfaces the recess 4 and the bottom portion of the recess 4. As a result, a relatively large amount of the metal film is deposited on the inner wall surface of the recess 4, especially on the bottom portion of the recess 4.

Figure 5:
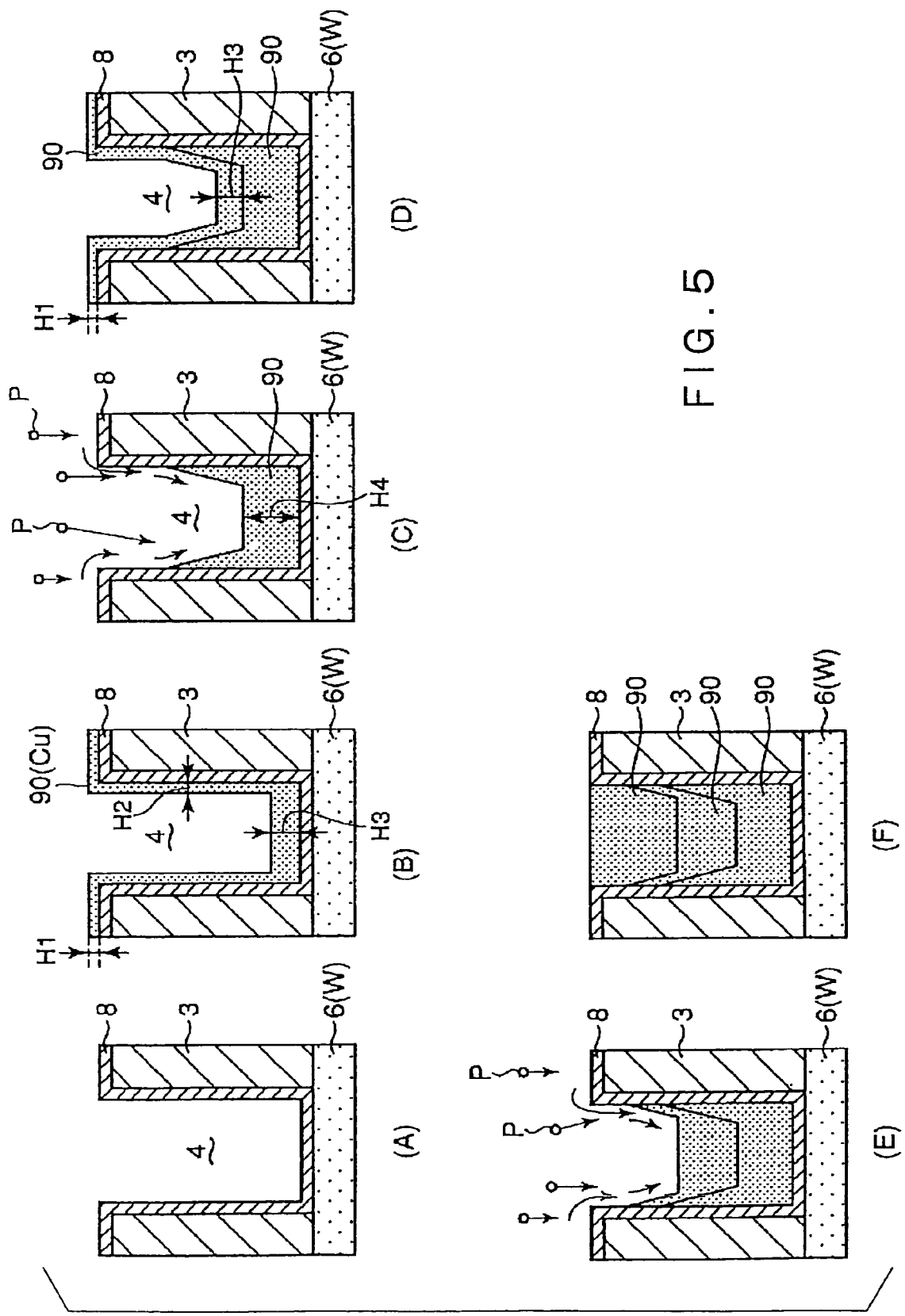
FIG. 5 shows schematic cross sectional views of a recess for explaining the process steps of the film forming method.
Figure 6:
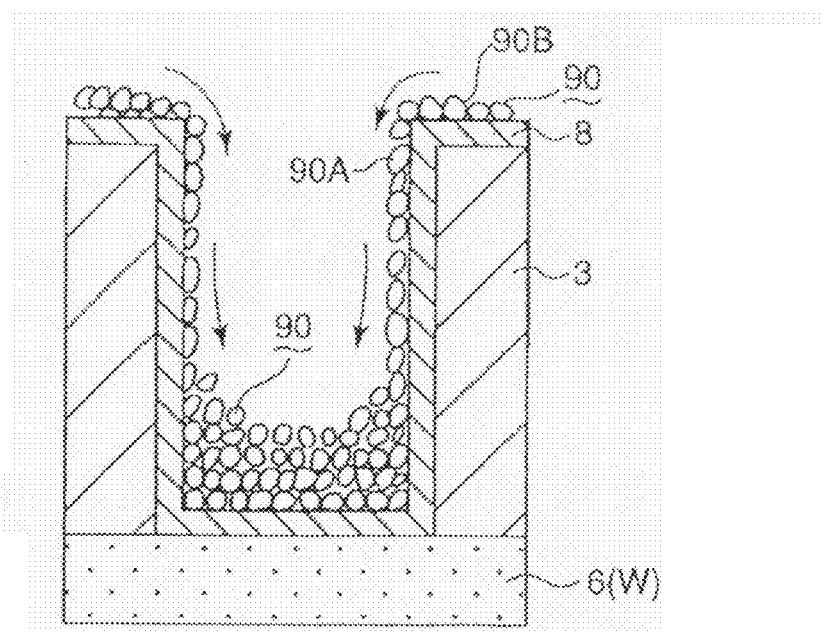
FIG. 6 is a schematic view for explaining the mechanism of a diffusion step.

With the understanding of the aforementioned phenomenon, the method according to the present invention will be further described with reference to FIGS. 4 to 6. First, the stage 34 shown in FIG. 1 is moved downwardly and the gate valve 50 is opened. The wafer W is then carried into the process vessel 24 and is supported on the support pins 46. Then, the stage 34 is moved upwardly and the wafer W is placed on the upper surface of the stage 34. The wafer W is attracted to the upper surface of the stage 34 by means of the electrostatic chuck 34B.

Figure 9:
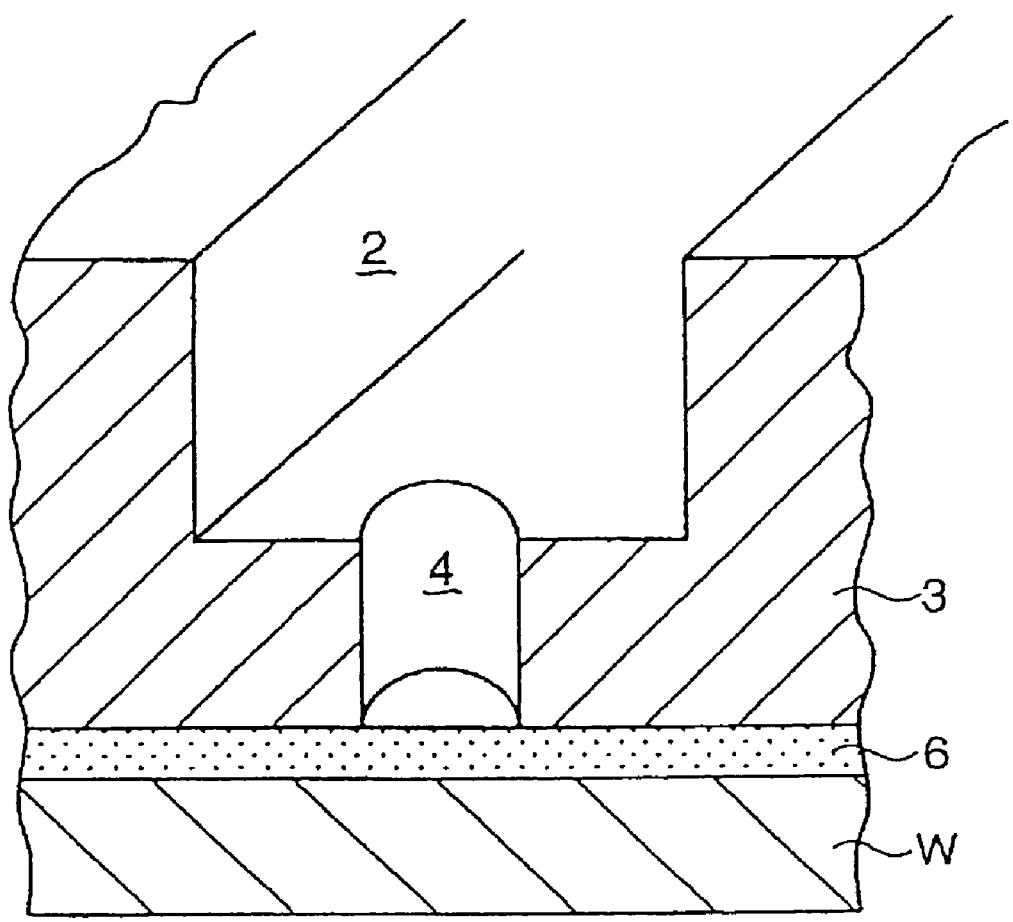
FIG. 9 is a cross-sectional/perspective view of an example of a recess formed in a surface of a semiconductor wafer.
Figure 10:
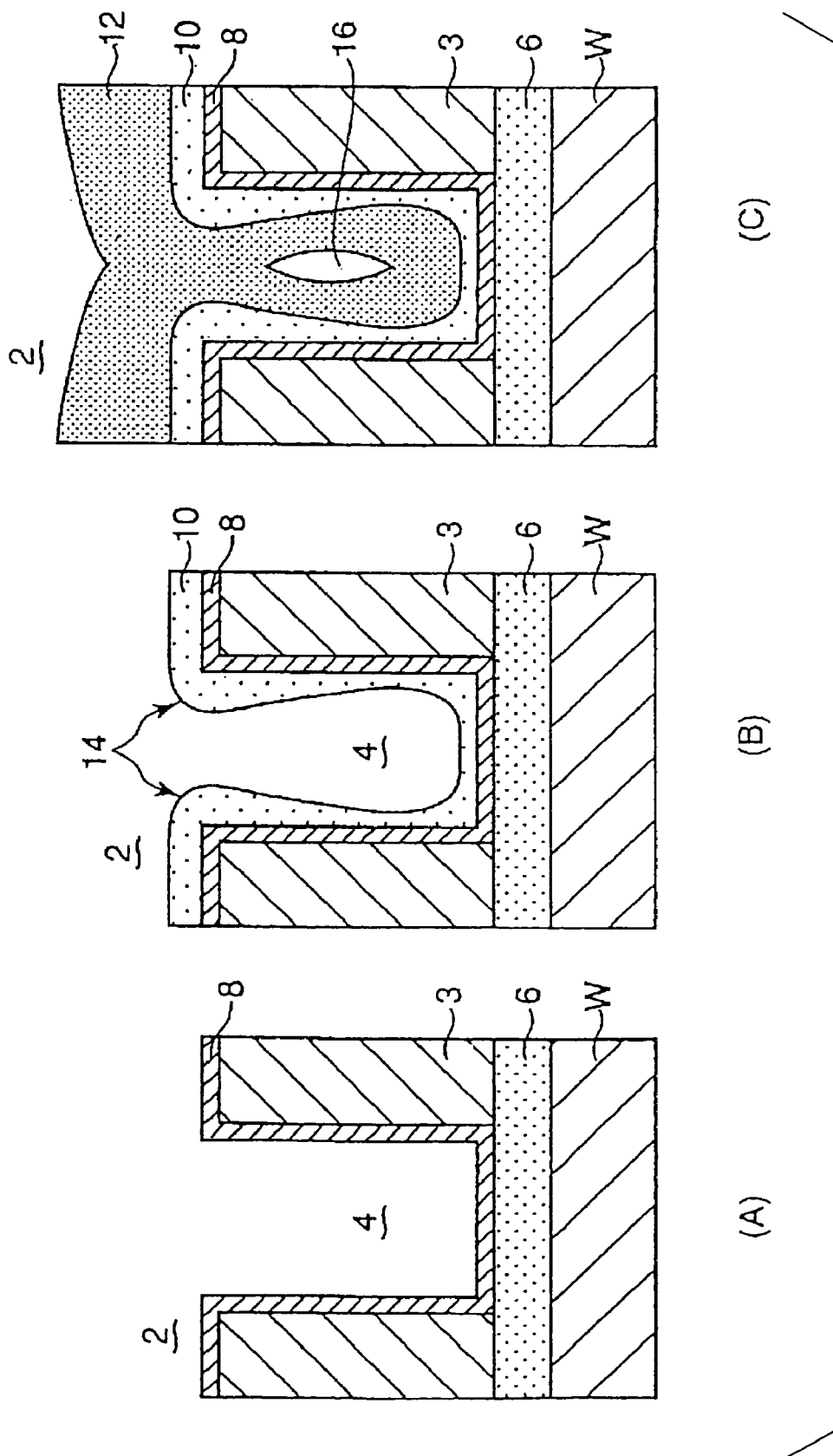
FIG. 10 is a schematic cross sectional view for explaining a conventional method of embedding a material in the recess formed in the surface of the semiconductor wafer.

Next, the film forming step is started. The recesses 2 and 4 having respective structures shown in FIGS. 9 and 10 are already formed on the surface (upper surface) of the wafer W, i.e., in the surface (upper surface) of the insulating layer 3 formed on the wafer W in this case. The upper recess 2 is a trench, or an elongated groove. The lower recess 4 is formed in the bottom surface of the recess 2 as a via hole or a through hole and extends to the wiring layer 6. In other words, viewed as a whole a stepped recess having a relatively wide upper space (2) and a relatively narrow lower space (4) is formed in the surface of the wafer W. Note that FIG. 5 only shows the lower recess 4 for simplification of the drawings and the explanation. Hereafter, the film forming step will be described on the assumption that the film is formed in the recess 4 shown in FIG. 5.

First, the barrier layer is formed. The film forming apparatus having the structure shown in FIG. 1 may be used for the formation of the barrier layer. In this case, tantalum (Ta) is used as the metal target 70. After the process vessel 24 is evacuated to a predetermined vacuum, the plasma power is applied to the induction coil 64 of the plasma source 62 and a predetermined bias power is applied to the electrostatic chuck 34B of the stage 34 by the bias power supply 54. In addition, a predetermined direct current power is applied to the metal target 70 by the variable direct current power supply 72. In order to firstly form a TaN film, a gas for plasma generation such as Ar gas and nitriding gas such as $N_2$ gas is supplied through the gas inlet port 78 into the process vessel 24. Thus, a TaN film is formed not substantially uniformly only on the upper surface of the wafer W but also on the side surfaces and the bottom surface of the recess 4. The TaN film may be formed by a conventional method. That is, the bias power is set in a range corresponding to region A1 shown in FIG. 3, i.e., approximately 100 W (watt).

After the TaN film formation is completed, Ta film formation is performed. The Ta film is deposited on the TaN film under the same conditions as those for the formation of the TaN film, except that the supply of the nitriding gas ($N_2$ gas) is stopped. The Ta film may be formed by a conventional method. That is, the bias power is set in a range corresponding to region A1 shown in FIG. 3. In this way, the barrier layer 8 composed of the TaN film and the Ta film is formed as the base layer (step S1 in FIG. 4, and FIG. 5(A)). The barrier layer 8 may have a single layer structure composed only of a Ta film.

Next, the wafer W having the barrier layer 8 formed thereon is transferred into another film forming apparatus for copper (Cu) film formation (also having the structure shown in FIG. 1), which is different from the film forming apparatus used for the formation of the barrier layer 8. The transferring of the wafer W is performed without the wafer W being exposed to the atmospheric atmosphere. It is preferable that the film forming apparatus for the barrier layer formation and the film forming apparatus for the Cu film formation are connected with each other through a transfer chamber which can be evacuated. Thereby, the wafer W can be transferred in a vacuum atmosphere between the film forming apparatuses without being exposed to the atmospheric atmosphere.

In order to perform the Cu film forming step, copper is used as the metal target 70. After the interior of the process vessel 24 is evacuated to a predetermined pressure, the plasma power is applied to the induction coil 64 of the plasma source 62 and a predetermined bias power is applied to the electrostatic chuck 34B of the stage 34 by the bias power supply 54. In addition, a predetermined direct current power is applied to the metal target 70 by the variable direct current power supply 72. Furthermore, the gas for plasma generation such as Ar gas is supplied to the process vessel 24 through the gas inlet port 78.

In this case, as previously described, the bias power is set within a range corresponding to region A2 of the graph shown in FIG. 3 to ensure that, on the surface (upper surface) of the wafer, the deposition rate of the metal particles is substantially equal to the plasma sputter etch rate. Thus, as shown in FIG. 5(B), a metal film 90 made of copper is formed on the inner wall surfaces of the recess 4 (step S2 in FIG. 4). As previously described, when the metal film once deposited on the upper surface of the wafer W is attacked by the plasma ions, the metal film is sputtered such that metal particles spatter therefrom. The metal particles are mostly not attached to the upper surface of the wafer W again. Thus, the thickness H1 of the metal film 90 deposited on the upper surface of the wafer is nearly equal to zero or a very small value. Note that, if the width of the upper recess 2 is much larger than 100 nm, a certain amount of the metal film may be deposited on the upper surface of the wafer W.

On the other hand, spattered metal particles, which are generated due to sputtering by the plasma ions having entered into the a narrow recess 4 having a width or diameter of 100 nm or less, are again attached to and deposited on the inner wall surfaces or the bottom portion of the recess 4. As a result, the thickness H2 of the metal film 90 deposited on the side surfaces of the recess 4 becomes a certain level, and the thickness H3 of the metal film 90 deposited on the bottom surface becomes largest. Thus, the thickness relation "H1<H2<H3" is established.

The film forming time is set to a value ensuring that the thickness H2 of the metal film 90 deposited on the side surfaces of the recess 4 is 5 nm or less, preferably 1 to 2 nm. If the thickness of the metal film 90 deposited on the side surfaces of the recess 4 is larger than 5 nm, Cu-aggregation occurs in the diffusion step and the process for diffusing the Cu metal film 90 cannot be successfully performed. In this case, surface diffusion occurs only in the superficial portion of the metal film 90 deposited on the side surfaces of the recess 4, while the deep portion of the metal film stays at its original position. If such processes are repeated, a void (refer to FIG. 10(C)) similar to that formed by a conventional film formation method may occur. If the bias power is excessively high in the film forming step, the barrier layer 8, i.e., the base layer, composed of the TaN film and the Ta film is etched. It is, therefore, preferable that the bias power be set to a value ensuring that the barrier layer 8 is not etched. Specifically, it is preferable that the bias power be set within a range from a value corresponding to point X1 (on the graph in FIG. 3) at which the film forming rate on the upper surface of the wafer is zero, or approximately 150 W, to a value corresponding to a point X2 (on the graph in FIG. 3) at which the barrier layer 8 is etched, or approximately 200 W. It is preferable to flow a cooling medium in the cooling medium circulation path 42 to cool the stage 34 in the film forming step.

After the film forming step is completed, the diffusion step is performed (step S3 in FIG. 4). The diffusion step is performed in the process vessel 24 of the film forming apparatus used in the film forming step. In the diffusion step, the temperature of the wafer is raised to a predetermined value at which surface diffusion of the Cu metal film 90 occurs, and the wafer temperature is then maintained at the predetermined value, thereby to cause Cu atoms contained in the metal film 90 to move toward the bottom portion of the recess 4 as shown in FIG. 5(c). In this case, the variable direct current power supply 72 is turned off to prevent a metal (Cu) particle from being released from the metal target 70.

In the diffusion step, the high frequency power supply 66 and the bias power supply 54 are maintained at ON-state, and the supply of the Ar gas continues. Thus, plasma derived from the Ar gas, i.e., argon ions P are continuously generated in the process vessel 24. The argon ion P is drawn onto the wafer W by the bias power and collides with the wafer W. The wafer W is heated by thermal energy generated by the collision. The power supplied by the bias power supply 54 is set to a small value so that the deposited Cu film is not etched again.

In this case, the temperature of the wafer W is set to a value at which surface diffusion of Cu atoms occurs but volume diffusion does not occur, i.e., the temperature of the wafer W is set to a value within the range of 200° C. to 400° C. As schematically shown in FIG. 6, when surface diffusion of Cu atoms occurs, the metal atoms (Cu atoms) 90A contained in the metal film 90 deposited on the side surface of the recess 4 are drawn into the metal film 90 existing in the bottom portion of the recess 4 and having a large mass, whereby the film thickness at the bottom portion of the recess 4 increases from H3 to H4 (refer to FIG. 5(C)). At the same time, metal atoms (Cu atoms) 90B, which is contained in the metal film 90 deposited on the upper surface of the wafer W outside the recess 4, are also drawn into the recess 4. Accordingly, the bottom portion of the recess 4 is preferentially embedded by the film forming step and the subsequent diffusion step.

If kinetic energy of the plasma (Ar ions) is excessively high in the diffusion step, the wafer W may be excessively heated up to a temperature of, for example, 400° C. or higher. It is thus desirable that the bias power be set to such a low value that prevents excessive heating of the wafer W. In addition, if the wafer is heated to a temperature at which volume diffusion of Cu atoms constituting the metal film 90 occurs, melted copper agglomerates. It is thus desirable that the bias power be set to such a low value that prevents occurrence of such a phenomenon. In order to promote the increase of temperature of the wafer W in the diffusion step, thermal conduction from the wafer W to the stage 34 may be suppressed by stopping supplying the thermally-conductive gas into the gas groove 36 to establish a vacuum state in the gas groove 36. Alternatively, the stage 34 may be heated by applying a current to the resistance heater 44. The diffusion step is performed in the aforementioned way for a predetermined time, e.g., several tens seconds. Note that, in a case where the thickness of the metal film to be deposited on the side surfaces of the recess 4 in the film forming step is 5 nm or less, the stage 34 need not be cooled, because agglomeration of the metal film does not occur on the side surfaces of the recess 4 even if the stage 34 is not cooled. In this case, the temperature of the stage 34 may be increased such that surface diffusion occurs during the film forming step.

The film forming step S2 and the diffusion step S3 are alternately performed a predetermined number of times (cycles) (No in step S4 in FIG. 4). As shown in FIG. 5(D), the Cu metal film 90 is formed again in the second film forming step. Then, in the second diffusion step, Cu atoms constituting the Cu metal film 90 formed in the second film forming step diffuse to move so that they are drawn into the bottom portion of the recess 4 as shown in FIG. 5(E). After the film forming step S2 and the diffusion step S3 have been repeatedly performed the predetermined number of times, e.g., several tens times (Yes in step S4 in FIG. 4), respectively, the recess 4 is embedded with Cu substantially entirely as shown in FIG. 5(F). After this state is achieved, the film forming process is completed.

The detailed process conditions in the film forming step S2 and the diffusion step S3 are as follows:

[Film Forming Step S2]

Process pressure: 30 to 100 mTorr, e.g., 50 mTorr (6.7 Pa)

Output power of the high frequency power supply 66 for plasma generation: 4 to 5.3 kW, e.g., 5.25 kW Output power of the variable direct current power supply 72: 0.5 to 2 kW, e.g., 1.2 kW Output power of the bias power supply 54: 120 to 170 W, e.g., 150 W Process time: e.g., 20 seconds (this varies depending on the thickness of a film to be deposited)

[Diffusion Step S3]

Process pressure: 30 to 100 mTorr, e.g., 50 mTorr (6.7 Pa)

Output power of the high frequency power supply 66 for plasma generation: 4 to 5.3 kW, e.g., 5.25 kW Output power of the variable direct current power supply 72: 0

Output power of the bias power supply 54: 50 W or less, e.g., 35 W

Process time: e.g., 30 seconds (this varies depending on the thickness of a film to be deposited)

[Number of Cycles of Film Forming Step S2+Diffusion Step S3]

Approximately 20 cycles (this varies depending on the size of the recess)

According to the present embodiment, the microscopic recess 4 can be embedded with a metal film successively from the bottom portion thereof without developing a defect such as a void, by repeatedly and alternately performing the film forming step and the diffusion step as mentioned above. According to the present embodiment, the microscopic recess 4 can be embedded with a metal such as copper only by the plasma sputtering process without a plating process. Accordingly, any problem that may occur in a case where embedment is performed by a plating process (e.g., growth of Cu grains is inhibited due to an additive agent contained in a plating solution) can be avoided. Thus, a wiring film can be formed by sufficiently-grown Cu grains, improving reliability of the wiring film.

In a case where the recess 4 is embedded with a Cu alloy instead of Cu, a Cu alloy target may be used. Although the foregoing explanation explains the embedding only of the narrow lower recess 4, the upper recess 2 may be embedded by alternately and repeatedly performing the film forming step S2 and the diffusion step S3 after the process step shown in FIG. 5(F) is completed. If the upper recess 2 is wide, e.g., if the upper recess 2 has a width or diameter of more than 100 nm, a metal film may be embedded in the upper recess 2 by performing a Cu plating process using the metal film 90 embedded in the lower recess 4 as a lower electrode after the process step shown in FIG. 5(F). If the upper recess 2 has a large width or a large diameter, an additive agent contained in a plating solution may be removed from the metal film by performing an annealing process after the plating process.

The present invention is not limited to the aforementioned embodiment and may be variously modified without departing from the spirit and the scope of the present invention. For example, the frequency of the high frequency power supply is not limited to 13.56 MHz and may be another frequency, e.g., 27.0 MHz. The inert gas for plasma generation is not limited to Ar gas and may be another inert gas, e.g., He gas or Ne gas. The object to be processed is not limited to a semiconductor wafer and may be an LCD substrate, a glass substrate, a ceramic substrate or the like.

[Experiment]

Copper was embedded in a microscopic recess by using the film formation method according to the present invention. The results will be described below.

Figure 7:
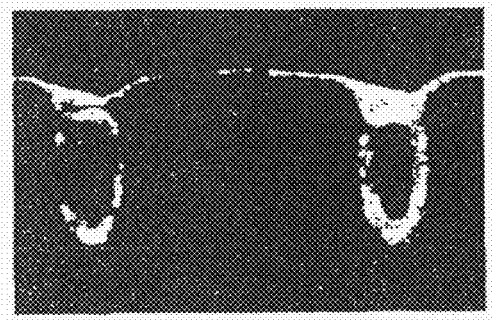
FIG. 7 shows electron micrographs and schematic views showing the experimental results.
Figure 7:
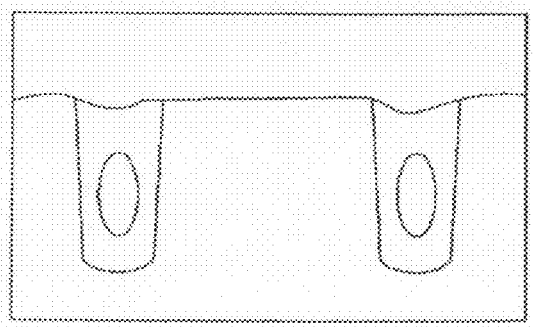
Figure 7:
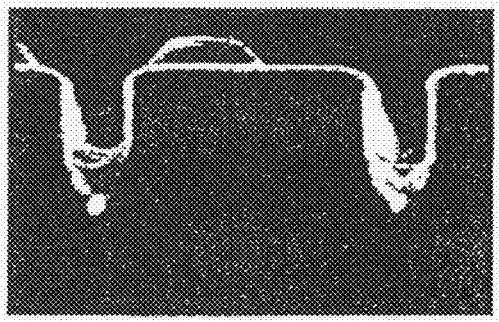
Figure 7:
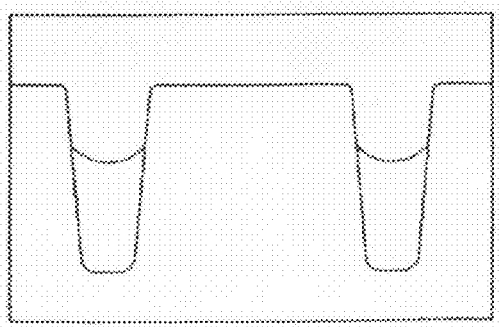

First, copper was embedded in a groove (trench) having a width of 100 nm. The results are shown in FIG. 7. FIG. 7(A) corresponds to a conventional method (without a diffusion step), and FIG. 7(B) corresponds to the method according to the present invention (indicating the state during the embedding). In FIG. 7, electron micrographs are shown on the upper side, and schematic illustrations for explaining the electron micrographs are shown on the lower side. The process conditions for the method according to the present invention are the same as the previously-described detail process conditions.

As shown in FIG. 7(A), with the conventional method, an overhang was grown in the vicinity of an open end of the recess to form a bridge, and a void was developed under the bridge. On the contrary, with the method according to the present invention, it is apparent that the copper was successfully embedded in the recess from the bottom side thereof without a void, as shown in FIG. 7(B).

Figure 8:
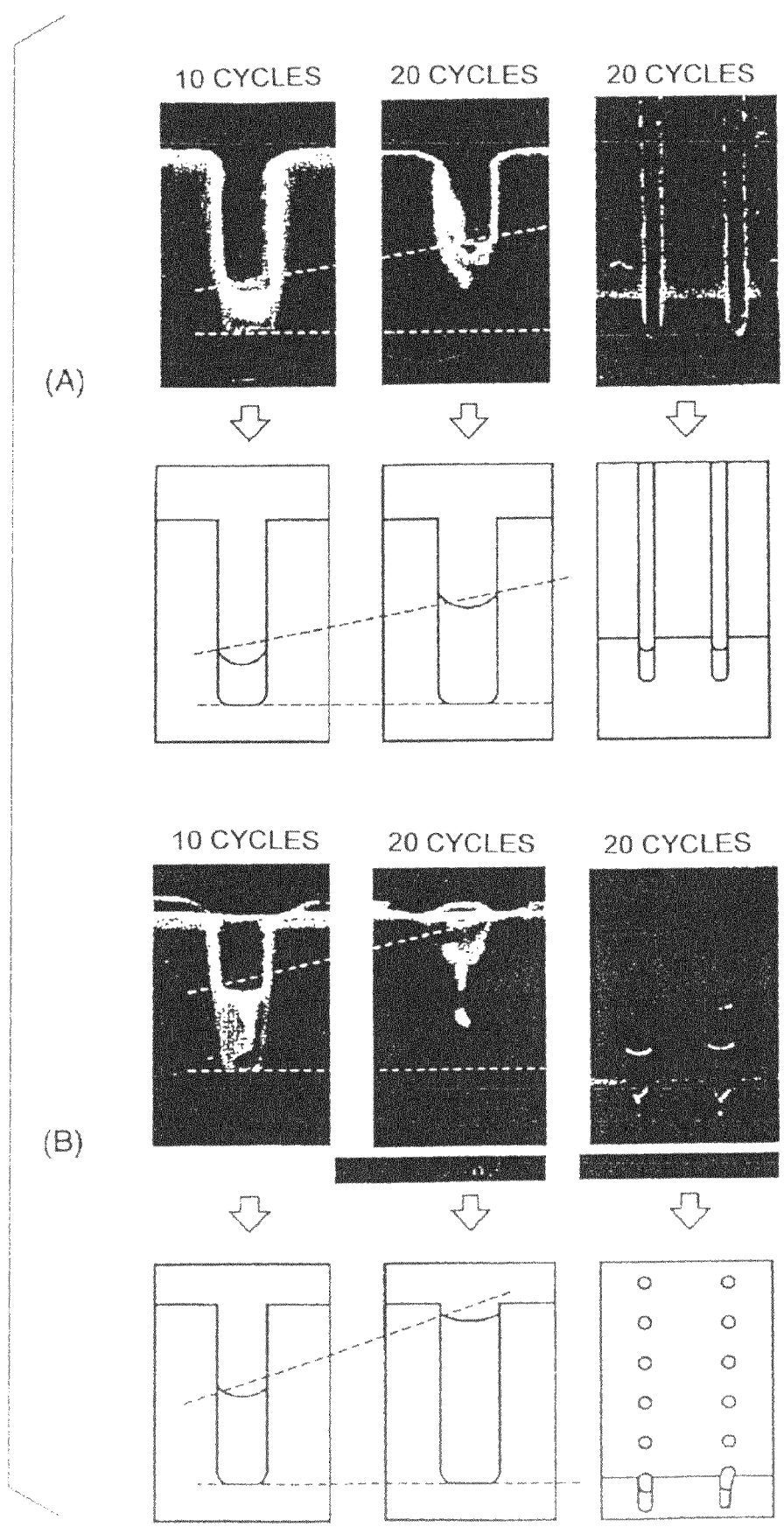
FIG. 8 shows electron micrographs and schematic views showing the experimental results.

Further, copper was embedded in a trench having a width of 100 nm and a hole having a diameter of 100 nm by using the film forming method according to the present invention. The results are shown in FIG. 8. FIG. 8(A) shows the result of trench embedding, and FIG. 8(B) shows the results of hole embedding. In FIGS. 8(A),(B), electron micrographs are shown on the upper side: the left electron micrograph showing the cross section after the film forming step and the diffusion step were performed 10 cycles; the center electron micrograph showing the cross section after the film forming step and the diffusion step were performed 20 cycles; and the right electron micrograph was take from a oblique angle after the film forming step and the diffusion step were performed 20 cycles, and schematic illustrations for explaining respective electron micrographs are shown therebelow.

As is apparent from FIG. 8(A), the copper was successfully embedded in the trench successively from the bottom portion thereof without development of a void, from the 10th process cycle (film forming step+ diffusion step) to the 20th process cycle. In addition, as is apparent from FIG. 8(B), the copper was successfully embedded into the hole without development a void, from the 10th process cycle to the 20th process cycle.

The invention claimed is:

1. A film forming method, comprising:
   a step of placing a process object on a stage disposed in a process vessel, the process object having a surface and a recess opening into the surface;
   a film forming step including a step of generating metal particles in the process vessel by generating plasma in the process vessel, by sputtering a metal target disposed in the process vessel by the plasma, and by applying bias power to the stage to draw the metal particles into the recess and deposit the metal particles in the recess, thereby embedding the recess with a metal, wherein the film forming step is performed under conditions that the bias power is set such that, on the surface of the process object, a deposition rate which is a rate of metal deposition caused by drawing-in of the metal particles is substantially equal to an etch rate which is a rate of sputter etching caused by the plasma;
   a diffusion step that maintains the process object at a predetermined temperature ensuring that surface diffusion occurs in a metal film deposited in the recess under conditions such that metal particles are not generated from the metal target, and metal atoms constituting the metal film move toward a bottom portion of the recess; and
   a step of alternately and repeatedly performing the film forming step and the diffusion step a plurality of times.

2. The method according to claim 1, wherein the bias power is of a level ensuring that a base layer, which has been formed on surfaces of the recess before said film forming method is performed, is not etched.

3. The method according to claim 1, wherein the predetermined temperature is lower than any temperatures at which volume diffusion of the metal atoms constituting the metal film occurs.

4. The method according to claim 1, wherein, in the diffusion step, the process object is heated by collision energy generated by collision of plasma with the process object.

5. The method according to claim 1, wherein the diffusion step is performed in the process vessel in which the film forming step is performed.

6. The method according to claim 1, wherein the recess comprises a groove having a width of 100 nm or less, or a hole having a diameter of 100 nm or less.

7. The method according to claim 1, wherein thickness of the metal film formed in each of the film forming steps is 5 nm or less.

8. The method according to claim 1, wherein the recess comprises a groove for wiring or a hole for wiring.

9. The method according to claim 1, wherein the metal film is made of copper or a copper alloy.

10. The method according to claim 9, wherein the predetermined temperature in the diffusion step is in a range of 200° C. to 400° C.

11. The method according to claim 1,
    wherein the recess has a relatively small lower space and a relatively large upper space,
    said method further comprising a plating step that embeds the upper space with a plating after the lower space is embedded with the metal film by repeatedly performing the film forming step and the diffusion step.

12. The method according to claim 1, wherein:
    the recess has a relatively small lower space and a relatively large upper space, and
    both the lower space and the upper space are embedded with the metal film by repeatedly performing the film forming step and the diffusion step.

* * * * *